United States Patent [19]
Hinedi et al.

[11] Patent Number: 5,986,472
[45] Date of Patent: Nov. 16, 1999

[54] VOLTAGE LEVEL TRANSLATION FOR AN OUTPUT DRIVER SYSTEM WITH A BIAS GENERATOR

[75] Inventors: Fahd Hinedi; Moises Cases; Satyajit Dutta, all of Austin, Tex.; Robert Heath Dennard, New Rochelle, N.Y.

[73] Assignee: International Business Machines Corporation, Armonk, N.Y.

[21] Appl. No.: 08/870,717

[22] Filed: Jun. 6, 1997

[51] Int. Cl.⁶ .............................................. H03K 19/094
[52] U.S. Cl. .................................... 326/68; 326/71; 326/81
[58] Field of Search ................................. 326/68, 70, 71, 326/80, 81, 86

[56] References Cited

U.S. PATENT DOCUMENTS

| | | | |
|---|---|---|---|
| 5,635,860 | 6/1997 | Westerwick | 326/81 |
| 5,684,415 | 11/1997 | McManus | 326/81 |
| 5,723,985 | 3/1998 | Van Tran et al. | 326/81 |
| 5,777,490 | 7/1998 | Cases et al. | 326/81 |
| 5,834,948 | 11/1998 | Yoshikazi et al. | 326/81 |

*Primary Examiner*—Michael Tokar
*Assistant Examiner*—Don Phu Le
*Attorney, Agent, or Firm*—Sawyer & Associates; Casimer K. Salys

[57] ABSTRACT

Circuit and method aspects are provided for voltage level translation circuit for an output driver. In a circuit aspect, a circuit includes an input mechanism for receiving an internal data signal of a first predetermined voltage range, at least two stacked transistors coupled to the input mechanism, and a bias generator coupled to the input mechanism and the at least two stacked transistors, the bias generator ensuring that the at least two stacked transistors operate below a predetermined maximum device voltage. The circuit further includes an output mechanism coupled to the at least two stacked transistors, the output mechanism providing an external signal of a second predetermined voltage range.

14 Claims, 2 Drawing Sheets

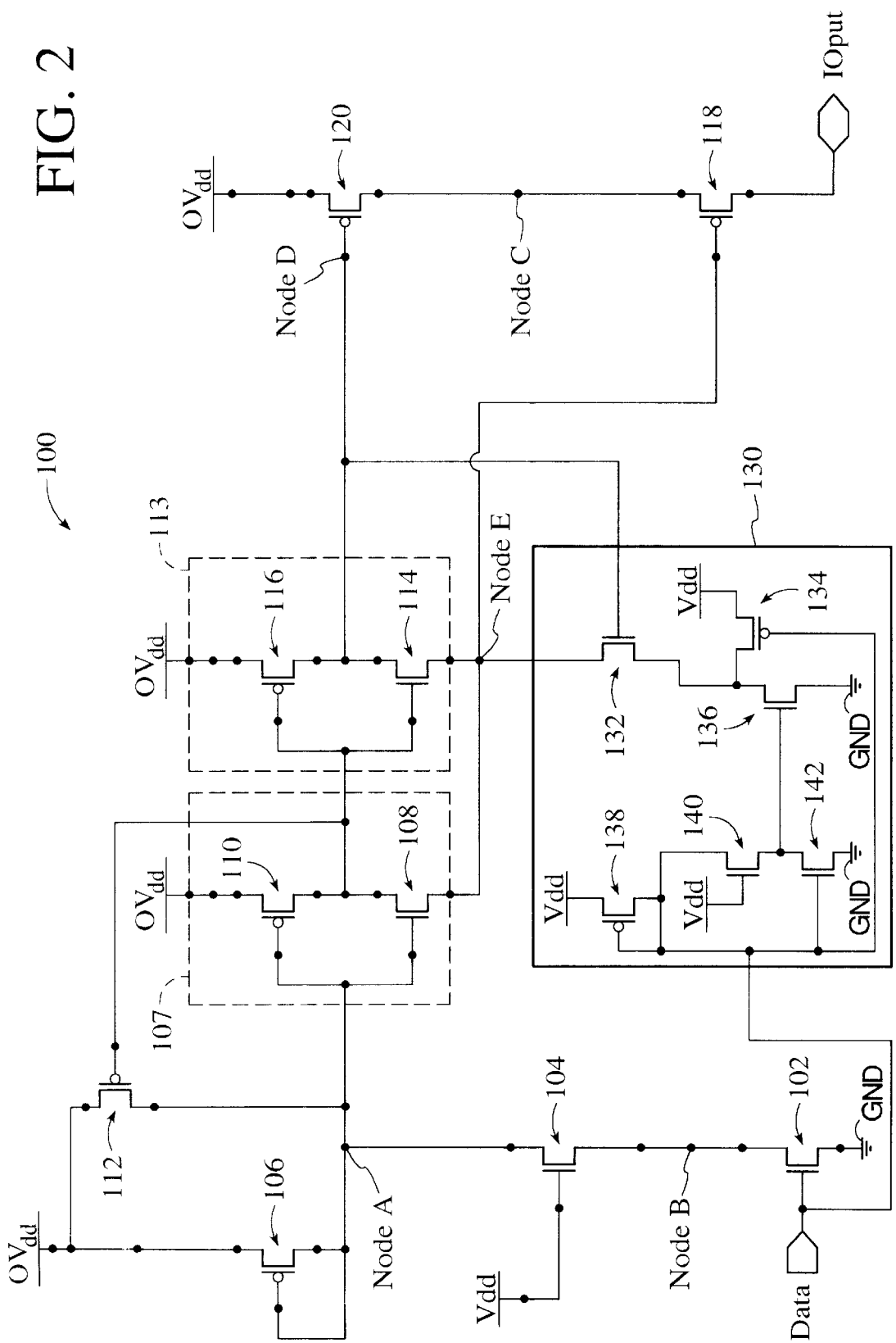

5,986,472

VOLTAGE LEVEL TRANSLATION FOR AN OUTPUT DRIVER SYSTEM WITH A BIAS GENERATOR

FIELD OF THE INVENTION

The present invention relates generally to input/output circuitry, and more particularly, to conversion of voltage levels for interfacing with output circuitry.

BACKGROUND OF THE INVENTION

As the development of computer systems proceeds, increases to the processing speed are continually desired. Typically, reduction in device geometries of system components is sought to help increase speed and density. Associated with the reduction in device size is a reduction in power supply voltage requirements. For example, it is possible for normal operating voltages in the processor to range between 0 volts (V) and 1.8 V.

Further, advances in processor technology is occurring at a much faster pace than in typical input/output (I/O) devices. Off chip drivers (OCDs) of processors interface with many different external devices, such as ASICs (application specific integrated circuits), SRAMs (static random access memories), etc. These external devices tend to be designed in earlier technologies and thus use higher core voltages, which in turn results in their driving higher voltages. For example, normal operating voltages range between 0 V and 3.3 V. The higher voltages driven by the external devices potentially damage FET (field effect transistor) devices in the output stage of the OCDs by violating the gate-source/drain voltage limitations of the processor technology.

For example, some fabrication techniques impose a relatively low predetermined limit on a maximum safe difference between a voltage level at a transistor's gate and a voltage level at a source/drain region of the transistor. In such a situation, if the transistor's source/drain region has a voltage level that differs from the voltage level at the transistor's gate by more than the predetermined limit, then the transistor's gate oxide could be damaged in a manner that destroys the transistor's operability.

The OCD design therefore has to be voltage level compatible with these existing external support devices. Usually, this results in OCDs being designed for use with a higher power supply voltage than that of the core processor logic. Additional design challenges regarding thin gate oxide protection and circuit performance thus result.

Accordingly, what is needed is improved thin gate oxide protection and circuit performance for OCDs and provision of improved design margins and device reliability.

SUMMARY OF THE INVENTION

Circuit and method aspects are provided for voltage level translation circuit for an output driver. In a circuit aspect, a circuit includes an input mechanism for receiving an internal data signal of a first predetermined voltage range, at least two stacked transistors coupled to the input mechanism, and a bias generator coupled to the input mechanism and the at least two stacked transistors, the bias generator ensuring that the at least two stacked transistors operate below a predetermined maximum device voltage. The circuit further includes an output mechanism coupled to the at least two stacked transistors, the output mechanism providing an external signal of a second predetermined voltage range.

A circuit aspect for achieving voltage level translation for an output driver circuit, and a method aspect for providing same include a first plurality of control devices, the first plurality of control devices translating a signal within a first predetermined voltage range for output as a signal within a second predetermined voltage range and including a stacked pair of PMOSFETs. A bias generator coupled to the stacked pair of PMOSFETs is further included, the bias generator comprising a second plurality of control devices and ensuring that a predetermined maximum device voltage for the stacked pair of PMOSFETs is not violated.

With the present invention, control devices maintain operation without risk of device damage during voltage level translation for output driver circuitry. A bias generator included in the invention capably prevents any violation of gate stress voltage in stacked PFET devices in the output driver stage. These and other advantages of the aspects of the present invention will be more fully understood in conjunction with the following detailed description and accompanying drawings.

BRIEF DESCRIPTION OF THE DRAWINGS

FIG. 2 illustrates the translation circuitry of FIG. 1 including a more detailed representation of the bias generator.

DESCRIPTION OF THE INVENTION

Figure 1:
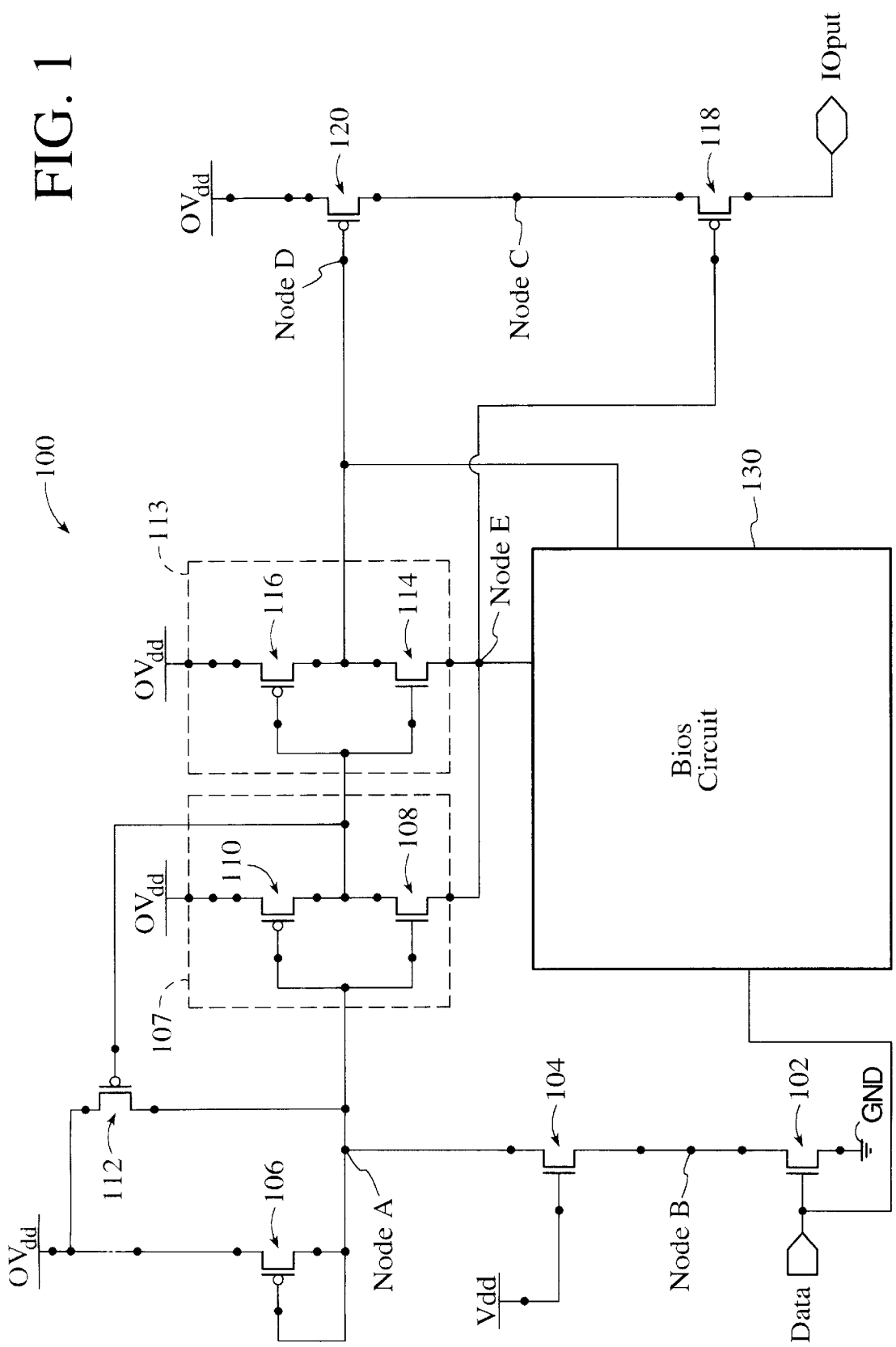
FIG. 1 illustrates translation circuitry in accordance with the present invention.

The present invention relates to voltage level translation circuitry for an output driver circuit. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

FIG. 1 illustrates translation circuitry in accordance with the present invention. A first supply voltage node Vdd has a voltage of approximately 1.8 V (±5%) relative to a reference voltage node GND (0 V). A second supply voltage node OVdd has a voltage of approximately 3.3 V (±5%) relative to GND.

The circuit includes transistors 102, 104, 106, 108, 110, 112, 114, 116, 118, and 120, which are metal oxide semiconductor (MOS) field effect transistors (FETs) and are suitably formed integrally with one another within the circuit. Each FET is a control device having a control node, i.e., a gate, and first and second conducting nodes, i.e., source/drain regions. Each control device suitably conducts electrical current between its two conducting nodes in response to a logic state of its control node, as is well understood by those skilled in the art.

Source/drain regions of n channel transistors 102, 104, 108, and 114 are suitably n-type diffusions formed within a p-type substrate which is connected to GND. Source/drain regions of p channel transistors 106, 110, 112, 116, 118, and 120 are suitably p-type diffusions formed within at least one n-type well which is connected to OVdd. Each of the transistors 102, 104, 106, 108, 110, 112, 114, 116, 118, and 120 suitably has a channel width-to-length ratio which is substantially optimized in order to account suitably for various aspects of the specific process technology used to fabricate the circuit.

An information node DATA is connected to a gate of transistor 102. A source of transistor 102 is connected to GND. A drain of transistor 102 is coupled through Node B to a source of transistor 104. A gate of transistor 104 is connected to Vdd.

A drain of transistor 104 is connected to Node A. Node A is connected to a drain of transistor 106, to a gate of transistor 106, and to a drain of transistor 112. Further, Node A is connected to an input of an inverter, indicated by dashed enclosure 107.

A source of transistor 106 is connected to OVdd and to a source of transistor 112. An output of inverter 107 is connected to a gate of transistor 112. Further, the output of inverter 107 is connected to an input of a second inverter, indicated by dashed enclosure 113. An output of inverter 113 is connected to a gate of transistor 120 at Node D. The gate of transistor 120 is further coupled to a bias circuit 130, the details of which are presented hereinbelow with reference to FIG. 2.

A source of transistor 120 is connected to OVdd. A drain of transistor 120 is coupled through Node C to a source of transistor 118. A gate of transistor 118 is connected to bias circuit 130 at Node E. A drain of transistor 118 is connected to an information node IOPUT, which is connected to other circuitry, such as input receiver circuitry (not shown).

Inverter 107 is formed by transistors 108 and 110. A source of transistor 108 is connected to bias circuit 130 through Node E. A source of transistor 110 is connected to OVdd. Respective gates of transistors 108 and 110 are connected to the input of inverter 107. Respective drains of transistors 108 and 110 are connected together.

Inverter 113 is formed by transistors 114 and 116. A source of transistor 114 is connected to bias circuit 130 through Node E. A source of transistor 116 is connected to OVdd. Respective gates of transistors 114 and 116 are connected to the input of inverter 113. Respective drains of transistors 114 and 116 are connected together.

Each of the transistors 108 and 114 has a threshold voltage (Vt) of approximately 0 V, so these transistors are substantially turned on in response to the gate voltage being above the source voltage. Each of the transistors 102 and 104 has a Vt of approximately 0.4 V, so each of these transistors is substantially turned on in response to gate voltage being more than 0.4 V below the source voltage.

In operation, a voltage at DATA varies between approximately 0 V and 1.8 V, whereas the voltage at IOPUT varies between a tri-state 'floating' condition and approximately 3.3 V. A voltage at Node A varies between approximately 1.8 V and 3.3 V. Accordingly, respective voltages at the output of inverters 107 and 113 vary between approximately 1.8 V and 3.3 V. More particularly, a 0 V voltage at DATA, e.g., indicative of a low logic level signal, is translated into a tri-state 'floating' condition at IOPUT, while a 1.8 V voltage at DATA, e.g., indicative of a high logic level signal, is translated into a steady-state 3.3 V voltage at IOPUT. Bias circuit 130 ensures that during the translation process, a predetermined limit based on processing technology of the maximum safe difference between a voltage at a transistor's gate and a voltage at a source/drain region of the transistor is not violated in the transistors 118 and 120. For example, a maximum difference of 2.4 V is tolerable.

As shown in FIG. 2, bias circuit 130 suitably is formed by transistors 132, 134, 136, 138, 140, and 142, with transistors 132, 140, and 142 n-type FETs (suitably n-type diffusions formed within a p-type substrate which is connected to GND) and transistors 134, 136, and 138 p-type FETs (suitably p-type diffusions formed within at least one n-type well which is connected to Vdd). Transistor 132 is coupled at its drain to Node E and at its gate to Node D. Its source is coupled to respective sources of transistors 134 and 136. The drain of transistor 134 is coupled to Vdd, while its gate is coupled the DATA node. The drain of transistor 136 is coupled to GND, while its gate is coupled to a source of transistor 140 and a drain of transistor 142. The source of transistor 142 is coupled to GND, and the gate of transistor 140 is coupled to Vdd. The drain of transistor 140 and the gate of transistor 142 are coupled to the DATA node. Also coupled to the drain of transistor 140 are the drain and gate of transistor 138. The source of transistor 138 is coupled to Vdd.

In operation, the inverter 107 gets driven by a level shifter circuit formed by transistors 102, 104, 106, and 112 through Node A. The output voltage level of the level shifter circuit at Node A is at either Vdd or OVdd depending on the DATA that is signalled. When DATA is at a logic one/high level, Node A is suitably driven down to Vdd, and Node D is driven to a bias voltage generated by bias circuit 130, i.e., approximately 1.8 V. Hence, output transistor 120 turns on without violating the predetermined Vgs limit and drives the source of output transistor 118 to OVdd, which in turn drives IOPUT, i.e., the bus, to OVdd. The gate of output transistor 118 suitably is driven to a bias voltage of about 1.3 V by bias circuit 130.

When DATA is at a logic zero/low, Node A gets driven high to near OVdd. This will cause inverter 113 to drive the gate of transistor 120 to OVdd, hence turning off transistor 120, because its gate's voltage is less than one Vt (about 0.4 V for transistor 120) below it's source's voltage. In such a situation, IOPUT has a tri-state floating condition, and the voltage at Node C somewhat varies according to the voltage IOPUT. For example, if IOPUT has a voltage of 0 V, then Node C has a voltage less than about 2.2 V, because transistor 118 is substantially turned on in a forward direction if it's gate voltage (i.e., 1.8 V) is more than one Vt (about 0.4 V) below Node C's voltage. Alternatively, if IOPUT has a voltage of about 3.3 V, then Node C's voltage is approximately equal to IOPUT's voltage, because transistor 118 is substantially turned on in a reverse direction if it's gate voltage is more than one Vt below IOPUT's voltage.

By comparison, in response to Node D having a steady-state voltage of about 1.8 V, transistor 120 is substantially turned on because it's gate voltage is more than one Vt below it's source voltage. This increases the voltage at Node C until its voltage is approximately 3.3 V. As the voltage at Node C increase above approximately 2.2 V, transistor 118 is substantially turned on, because it's gate voltage is more than one Vt below it's source voltage. This increases the voltage at IOPUT until it's voltage is approximately equal to Node C's voltage. In this manner, IOPUT's voltage eventually increases along with Node C's voltage to a steady-state voltage of about 3.3 V.

With the gate of the stacked output transistors 118 and 120 tied to the bias circuit 130, proper bias voltage for device protection is provided. The bias circuit 130 provides the flexibility of supplying a controlled bias voltage allowing for a more optimum design point and higher noise margin. The bias circuit 130 also provides the proper bias voltage for inverters 107 and 113.

With the use of bias circuit 130, the voltage at Node D is not decreased below about 1.8 V, so that the gate-source voltage differential of 2.4 V is not exceeded in transistor 120, thus ensuring device protection. Similarly, bias circuit 130 further ensures that Node E varies between about 1.3 V and 1.8 V to ensure protection for transistor 118. The ability to apply 1.3 V at Node E increases device design flexibility by allowing smaller device design without risk of violation of device voltage limits. Further, varying the voltage at Node E to about 1.8 V safeguards against device damage when a voltage higher than 3.3 V, e.g., 4.0 V, is applied at IOPUT. Thus, with the utilization of bias circuit 130, any violation of gate stress voltage is prevented as long as the voltage difference between VDD and OVDD is less than or equal to the process Vgs limit.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for achieving voltage level translation for an output driver circuit the method comprising:

providing a first plurality of control devices to translate an internal voltage level for output as an external voltage level;

providing a bias generator, the bias generator comprising a second plurality of control devices, the bias generator ensuring that a maximum device voltage level of an output portion of the first plurality of control devices comprising stacked first and second output control devices is not exceeded;

coupling a first control device of the second plurality of control devices to a control node of a first stacked control device; and coupling the first control device to a control node of a second stacked control device.

2. The method of claim 1 wherein the stacked first and second control devices comprise PMOSFETs.

3. The method of claim 2 wherein the first control device further comprises an NMOSFET coupled at a gate to a gate of the first stacked PMOSFET and at a drain to a gate of the second stacked PMOSFET.

4. A voltage level translation circuit for an output driver comprising:

input means for receiving an internal data signal of a first predetermined voltage range;

at least two stacked transistors coupled to the input means;

a bias generator coupled to the input means and each gate of the at least two stacked transistors, the bias generator ensuring that the at least two stacked transistors operate below a predetermined maximum device voltage and providing a voltage between about 1.8 V and 3.3 V to a gate of a first transistor of the at least two stacked transistors; and output means coupled to the at least two stacked transistors, the output means providing an external signal of a second predetermined voltage range.

5. The circuit of claim 4 wherein the first predetermined voltage range is between about 0 V and 1.8 V.

6. The circuit of claim 5 wherein the second predetermined voltage range is between about 0 V and 3.3 V.

7. The circuit of claim 4 wherein the predetermined maximum device voltage is about 2.4 V.

8. The circuit of claim 4 wherein the bias generator provides a voltage between about 1.3 V and 1.8 V to a gate of a second transistor of the at least two stacked transistors.

9. An output driver circuit with voltage level translation, the circuit comprising:

a first plurality of control devices comprising first and second inverters for translating a signal within a first predetermined voltage range for output as a signal within a second predetermined voltage range, the first plurality of control devices including a stacked pair of PMOSFETs; and a bias generator coupled to the stacked pair of PMOSFETs, the bias generator comprising a second plurality of control devices and ensuring that a predetermined maximum device voltage for the stacked pair of PMOSFETs is not violated.

10. The circuit of claim 9 wherein an output of the second inverter is coupled to a gate of one of the stacked pair of PMOSFETs.

11. The circuit of claim 10 wherein the bias generator is coupled to the output of the second inverter.

12. The circuit of claim 9 wherein the predetermined maximum device voltage is approximately 2.4 V.

13. The circuit of claim 9 wherein the first predetermined voltage range comprises approximately 0 V to 1.8 V.

14. The circuit of claim 13 wherein the second predetermined voltage range comprises approximately 0 V to 3.3 V.

* * * * *